(12) United States Patent
Bergogne et al.

(10) Patent No.: US 12,099,097 B2
(45) Date of Patent: Sep. 24, 2024

(54) MONITORING AGING OF A COMPONENT (71) Applicants: Commissariat à l'Energie Atomique et aux Energies Alternatives, Paris (FR); CEFEM INDUSTRIES, Saint Michel de Boulogne (FR)

(72) Inventors: Dominique Bergogne, Grenoble (FR); Jérôme Willemin, Grenoble (FR); Jérôme Fangier, Saint Michel de Boulogne (FR); Redouane Hammal, Saint Michel de Boulogne (FR); Lionel Fangier, Saint Michel de Boulogne (FR)

(73) Assignees: Commissariat à l'Energie Atomique et aux Energies Alternatives (FR); CEFEM INDUSTRIES (FR)

( * ) Notice: Subject to any disclaimer, the term of this patent is extended or adjusted under 35 U.S.C. 154(b) by 194 days.

(21) Appl. No.: 17/757,009

(22) PCT Filed: Dec. 11, 2020

(86) PCT No.: PCT/EP2020/085808
§ 371 (c)(1),
(2) Date: Oct. 14, 2022

(87) PCT Pub. No.: WO2021/116436
PCT Pub. Date: Jun. 17, 2021

(65) Prior Publication Data
US 2023/0027986 A1 Jan. 26, 2023

(30) Foreign Application Priority Data
Dec. 13, 2019 (FR) ..................... 1914416

(51) Int. Cl.
*G01R 31/64* (2020.01)
*G01R 31/12* (2020.01)

(52) U.S. Cl.
CPC .......... *G01R 31/64* (2020.01); *G01R 31/1227* (2013.01)

(58) Field of Classification Search
CPC ..... G01R 31/64; G01R 31/26; G01R 31/2642
See application file for complete search history.

(56) References Cited

U.S. PATENT DOCUMENTS

2015/0130380 A1\* 5/2015 Kato .................. H02P 6/12
318/400.21
2020/0363480 A1\* 11/2020 Schnell ............... G01R 31/016
2022/0155384 A1\* 5/2022 Lovati ............... G01R 27/2605

FOREIGN PATENT DOCUMENTS

EP 1338874 A1 8/2003
EP 3242138 A1 11/2017
WO 2013110027 A1 7/2013

OTHER PUBLICATIONS

Wang et al., Lifetime Estimation of DC-Link Capacitors in Adjustable Speed Drives Under Grid Voltage Unbalances, IEEE vol. 34, May 2019 (Year: 2019).\*

(Continued)

*Primary Examiner* — Benyam Haile
(74) *Attorney, Agent, or Firm* — Jordan IP Law LLC (57) ABSTRACT

The present description concerns a circuit (5) for monitoring the operation of a component (1) associated with equipment (3), comprising: at least one device (100) for measuring one or a plurality of physical quantities associated with the operation of the component; and a circuit for calculating a value representative of a remaining lifetime of a component, said monitoring circuit (5) being linked to the equipment.

17 Claims, 4 Drawing Sheets

(56) References Cited

OTHER PUBLICATIONS

International Search Report for International Application No. PCT/EP2020/085808 dated Mar. 15, 2021, 4 pages.
Translation of the Written Opinion of the International Search Authority for International Application No. PCT/EP2020/085808, 9 pages.

* cited by examiner

MONITORING AGING OF A COMPONENT

The present patent application claims the priority benefit of French patent application 19/14416 which is herein incorporated by reference.

FIELD

The present disclosure generally concerns systems for estimating the aging of an electrical or power electronics element or component. The present disclosure more particularly applies to systems where results of measurements or of estimates are transmitted outside of the equipment containing or to which is coupled the component having its aging estimated.

BACKGROUND

The estimation of the aging or of the remaining lifetime of an electrical or electronic component is widely used in power equipment, for example, power generation, transformation, or supply plants and in industrial plants. Such an estimation enables to detect a need for maintenance on the equipment or for a replacement of the component as a precaution to avoid failures.

A category of particularly monitored components concerns power capacitors. Such components can be found in most equipment forming part of power supply, transport, and conversion plants, or industrial equipment.

Known techniques for estimating the aging of a capacitor generally use lifetime estimation algorithms based for example on temperature, current, and/or voltage measurements at the level of the capacitor. Measurements are periodically performed at the level of the capacitor and are transmitted to a distant system. The processing of the measurements is generally performed on the distant system side, which requires a relatively large volume of data to be transmitted and a high power consumption on the capacitor side.

Document WO 2013/110027 describes techniques for determining the state of light-emitting diodes and power supply.
Document US 2015/130380 described a motor control device.
Document EP 3 242 138 describes a method for diagnosing the state of a capacitor in a modular converter.
Document EP 1 338 874 describes a method for estimating the remaining lifetime, a temperature detection structure, and electronic equipment.

SUMMARY

There exists a need to improve systems for estimating the aging of a component to predict a possible failure thereof.

There exists a need for simple and power-efficient solutions, particularly on the side of the equipment, equipped with the monitored component or to which it is coupled.

An embodiment overcomes all or part of the disadvantages of known systems.

An embodiment provides a solution adaptable to existing equipment, equipped with components to be monitored.

An embodiment provides a solution particularly adapted to capacitors.

An embodiment provides a circuit for monitoring the operation of a component associated with equipment, comprising:

at least one device for measuring one or a plurality of physical quantities associated with the operation of the component; and
a circuit for calculating a value representative of a remaining lifetime of the component, said monitoring circuit being linked to the equipment.

An embodiment provides a method of monitoring the operation of a component associated with equipment, comprising the steps of:

measuring one or a plurality of physical quantities associated with the operation of the component; and
calculating a value representative of a remaining lifetime of the component, said calculation being performed in a circuit linked to the equipment.

According to an embodiment, the value representative of the remaining lifetime is stored in non-volatile fashion in the monitoring circuit.

According to an embodiment, said value representative of the remaining lifetime is transmitted to a distant system, over a wireless link.

According to an embodiment, the frequency of transmission of said value representative of the remaining lifetime is smaller than the frequency of calculation of this value.

According to an embodiment, current measurements of the physical quantities are compared with thresholds to determine an operating zone where the component is located.

According to an embodiment:
current voltage and temperature measurements are compared with thresholds to determine an operating zone where the capacitor is located, the operating zones corresponding to zones of the voltage/temperature space, with a "central" zone around a nominal voltage and temperature pair, at least one "peripheral" zone of degraded operation of the capacitor different from a "non-functional" zone where the power supply voltage and the temperature no longer enable the monitoring circuit to operate;
the operating zone where the capacitor is located conditioning the non-volatile storage of a parameter in the monitoring circuit.

According to an embodiment, the operating zone of the component conditions the implementation of the calculation of the value representative of the lifetime and its non-volatile storage.

According to an embodiment, in an operating zone, no update of the value representative of the remaining lifetime is performed.

According to an embodiment, an operating zone further conditions the transmission of a signal representative of a malfunction of the component to the distant system.

According to an embodiment, a counter of the remaining lifetime is deleted by being positioned at zero.

According to an embodiment, a remaining lifetime resets the counter of the remaining lifetime.

According to an embodiment, an alarm is triggered and stored in the memory, for example when the nominal voltage is exceeded or the nominal temperature range is exceeded.

According to an embodiment, the calculation of the value representative of the remaining lifetime is performed at a frequency in the range from one second to one minute.

According to an embodiment, the component is a capacitor.

According to an embodiment, the measured quantities are the voltage across the capacitor and the temperature of the capacitor.

According to an embodiment, the calculation of the remaining lifetime, DDV, applies the following formula:

$$\frac{DDV}{DDVn} = \left(\frac{V}{Vn}\right)^{-8} 2^{(Tn-T)/15}$$

where DDVn represents the nominal value of the lifetime of the capacitor, V represents the current value of the voltage measured across the capacitor, Vn represents the value of the nominal voltage across the capacitor, T represents the current value of the operating temperature of the capacitor, and Tn represents the value of the nominal operating temperature of the capacitor.

According to an embodiment, the monitoring circuit is physically integrated to the component on manufacturing thereof.

According to an embodiment, the monitoring circuit is directly powered across the component.

An embodiment provides a circuit for monitoring the operation of a component comprising a capacitor and being associated with equipment, the circuit comprising:

at least one device for measuring the voltage across the capacitor and the temperature of the capacitor; and a circuit for calculating a value representative of a remaining lifetime of the component, applying the following formula:

$$\frac{DDV}{DDVn} = \left(\frac{V}{Vn}\right)^{-8} 2^{(Tn-T)/15}$$

where DDVn represents the nominal value of the lifetime of the capacitor, V represents the current value of the voltage measured across the capacitor, Vn represents the value of the nominal voltage across the capacitor, T represents the current value of the operating temperature of the capacitor, and Tn represents the value of the nominal operating temperature of the capacitor;

said monitoring circuit being physically integrated to the component on manufacturing thereof and being directly powered across the capacitor; and said calculation using at least two temperature measurements distributed inside or on top of the capacitor, to detect temperature variations likely to occur locally at different points of the capacitor.

According to an embodiment, the monitoring circuit uses at least two temperature measurements distributed inside and on top of the component, to detect temperature variations likely to locally occur at different points of the component, for example, at the periphery and at the center of the component.

According to an embodiment, the temperature taken into account for the calculation of the lifetime is equal to the average of the temperatures measured by the temperature sensors.

According to an embodiment, the temperature taken into account for the calculation of the lifetime is equal to the maximum value among the temperatures measured by the temperature sensors.

According to an embodiment, a remaining lifetime which is null or smaller than a threshold triggers the transmission of a signal.

An embodiment provides a system comprising:
an equipment;
a component associated with the equipment; and
a circuit for monitoring the operation of the component.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the equipment associated with one or a plurality of components monitored by the described system has not been detailed, the described embodiments being compatible with usual equipment. Further, the processing of the information transmitted by the described monitoring circuit has not been detailed, this processing being compatible with processing performed by usual systems.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
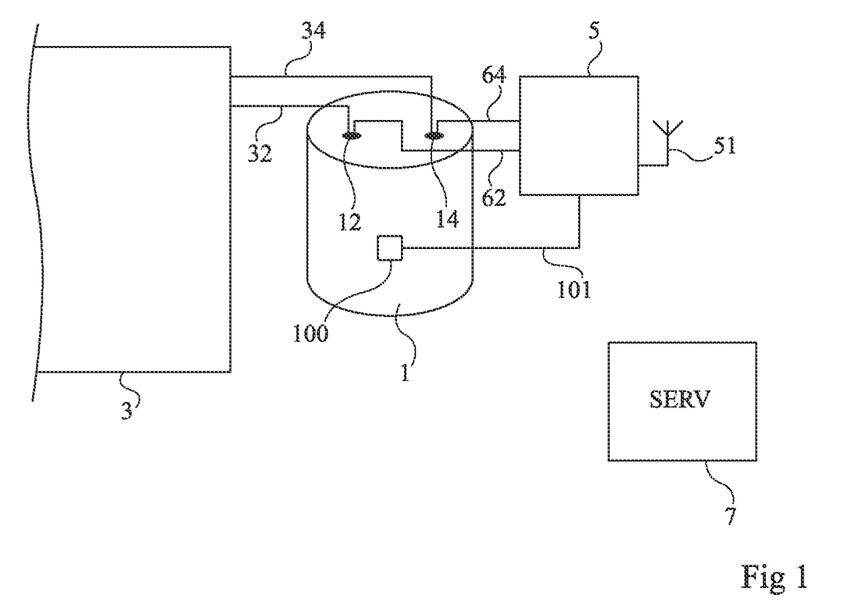
FIG. 1 very schematically shows an embodiment of a system for monitoring a component.

FIG. 1 very schematically shows an embodiment of a system for monitoring a component.

The described embodiments more particularly apply to the monitoring of components associated with equipment itself deprived of microcontroller-type low-voltage electronic circuits, so that it does not easily have a calculation capacity. By associated or linked to the equipment, there is meant a component which is physically linked to the equipment, embedded therein, bonded to the equipment, or attached thereto.

In the shown example, the component to be monitored is a capacitor 1, for example, a power capacitor, of film type. Capacitor 1 equips equipment 3 and is coupled by its two electrodes 12 and 14 (link symbolized by wires 32 and 34 coupling equipment 3 to the electrodes 12 and 14 of capacitor 1). Component 1 preferably comprises other elements (elements of a monitoring circuit) associated with the capacitor in a package as discussed in relation with FIG. 5.

The equipment is for example a power converter (transformer of the electric distribution network, solar plant converter, etc.), power equipment of a power generation plant (solar, thermal, etc.), industrial equipment (machine tool, conveying plant, etc.), and more generally any type of equipment using one or a plurality of power capacitors.

The monitoring of the aging of the power capacitors is particularly useful since they generally equip equipment where a failure of a capacitor may adversely affect the operation, or even the security of the plant comprising the equipment.

According to the described embodiments, the operation of the component is monitored and its remaining lifetime is estimated rather than its aging.

This monitoring is, in the embodiment of FIG. 1, performed by an electronic circuit 5 linked to or associated with capacitor 1, and coupled to its two electrodes 12 and 14 (link symbolized by leads 62 and 54 coupling circuit 5 to the two electrodes 12 and 14 of capacitor 1). Circuit 5 further communicates, preferably by a wireless transmission (antenna 51) with a server 7 or a distant system for managing equipment 3. Circuit 5 may also be coupled by an electrical link 101 to a temperature probe 100 placed against or within (at the center of) capacitor 1.

Figure 5:
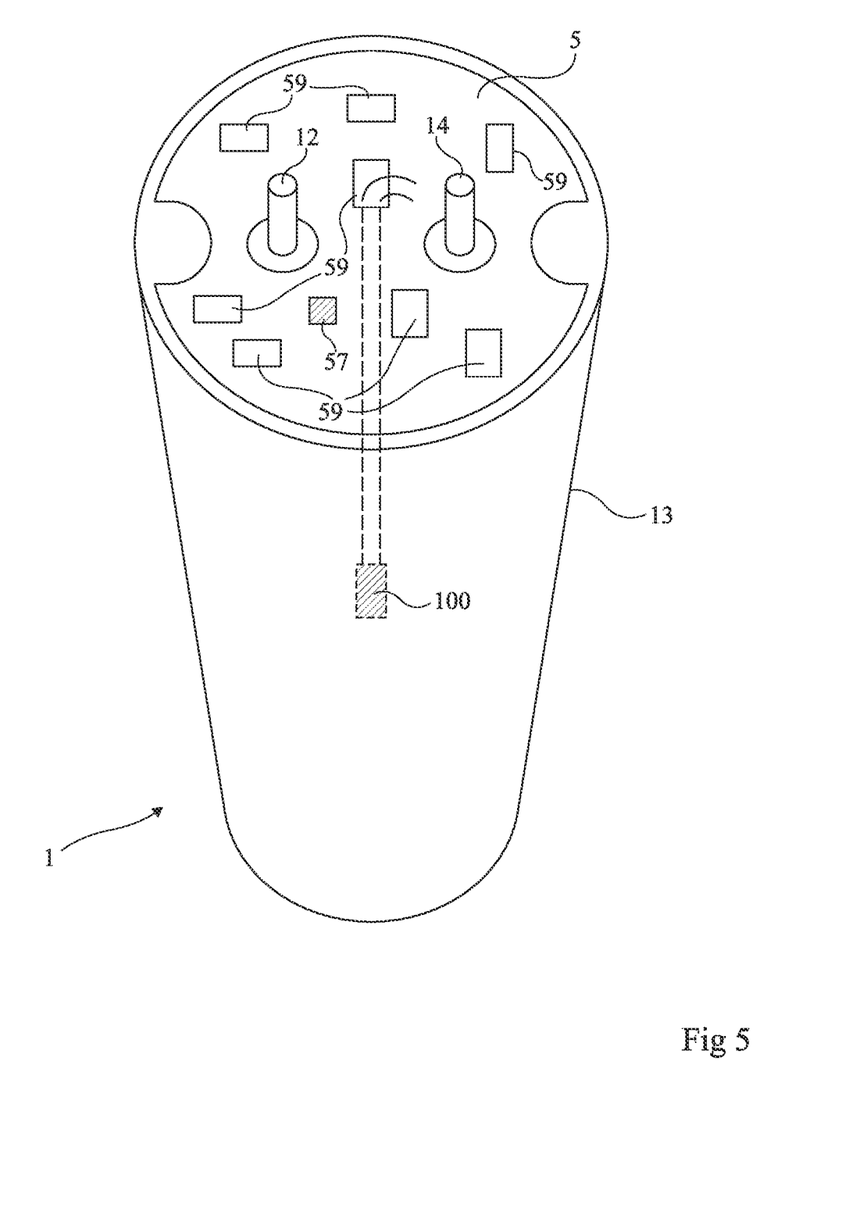
FIG. 5 very schematically shows a perspective view of an embodiment of a component.

By circuit 5 linked to component 1, there is meant an electronic circuit which is physically and electrically coupled, in wired fashion, to the equipment having the component associated therewith. In other words, circuit 5 is supported by, contained, or "embedded" in equipment 3 like the component to be monitored. Advantageously, circuit 5 may be supported by, contained, or "embedded" in capacitor 1, more precisely in a package of the capacitor as illustrated in FIG. 5. In this case, circuit 5 is associated with the capacitor on manufacturing thereof. Preferably, monitoring circuit 5 is physically integrated to component 1 on manufacturing thereof.

Circuit 5 is, according to the described embodiments, a self-contained circuit, performing measurements of physical quantities, on the capacitor side, and calculating, internally, at least one quantity representative of the remaining lifetime. Preferably, the physical quantities measured on the capacitor side are the voltage thereacross and its temperature.

Distant system 7 may take any usual form in this type of application. It is for example the control room of a power generation plant, of an operational occurrence management center, etc. It may also be a wireless polling system such as a tablet, a smart phone, a near-field communication (NFC) or radio frequency identification (RFID) contactless reader.

Unlike most usual systems, it is provided to perform the estimation of the remaining lifetime at the level of the circuit 5 associated with the capacitor to be monitored. Preferably, circuit 5 does not transmit to the distant system (server 7) the performed measurements, but a result representative of the remaining lifetime. Thus, the data volume to be transmitted is considerably decreased, which takes part in decreasing the power consumed by circuit 5.

Figure 2:
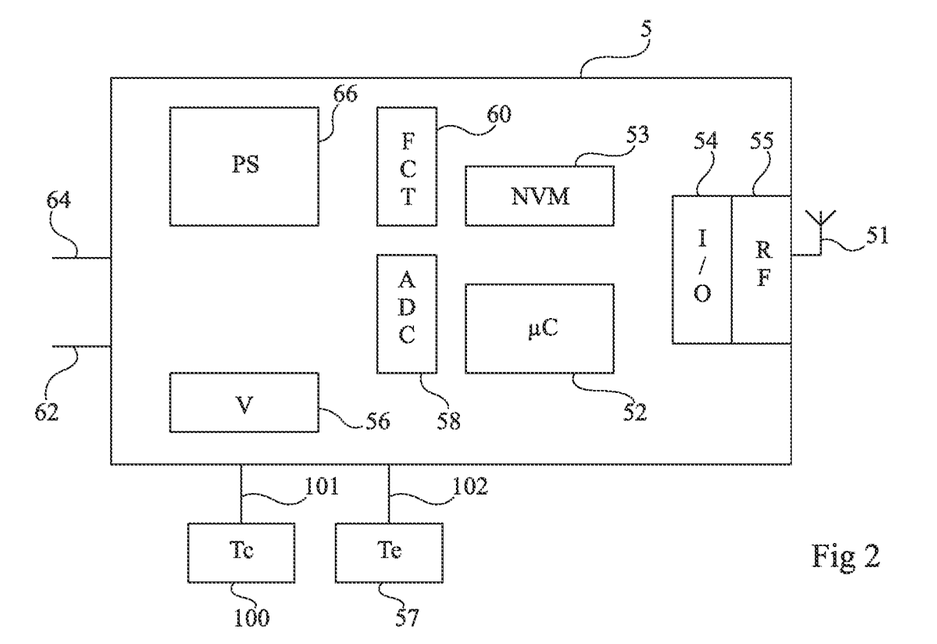
FIG. 2 very schematically shows in the form of blocks an embodiment of a circuit for monitoring a component.

FIG. 2 very schematically shows in the form of blocks an embodiment of a circuit 5 for monitoring a component.

According to this embodiment, circuit 5 comprises a microcontroller 52 (μC) having the role of interpreting the measurements of the physical quantities taken into account, to calculate the result of the estimation of the remaining lifetime and to organize its transmission to distant system 7. Microcontroller 52 is associated with a rewritable non-volatile memory 53 (NVM) particularly intended to store the result of the estimation, and to an input/output interface 54 (I/O) intended for antenna 51 via a radio frequency transceiver circuit 55 (RF).

Further, circuit 5 comprises and/or is coupled to sensors of physical quantities of the monitored component. In the shown example, these physical quantities are the voltage V across capacitor 1 and the temperatures Te at the periphery (57) and Tc at the center (100) of capacitor 1. The circuit thus manages sensors or circuits (blocks 56, V, block 57, Te and/or block 100, Tc) for measuring information representative of voltage V and of the temperatures. According to the case, the most significant temperature for the operating state and the lifetime estimation may be located either at the center of the capacitor (measurement performed by sensor 100), or on its periphery (measurement performed by sensor 57). Temperature sensor 57 may be located on the electronic map of circuit 5. Thus, according to an embodiment, the monitoring circuit (5) uses at least two temperature measurements distributed inside or on top of the component (1), to detect temperature variations likely to locally occur at different points of the component, for example, at the periphery and at the center of the component.

If the quantities delivered by sensors 56, 57, and 100 are analog, then they are converted into digital data, interpretable by microcontroller 52, by one or a plurality of analog-to-digital converters 58 (ADC).

Circuit 5 may further comprise other elements and functions, symbolized by a block 60 (FCT or function) in FIG. 2, according to the application. For example, it may be:
  sensors of different physical quantities (for example, current, pressure, humidity, etc.) according to the nature of the component to be monitored;
  specific transmission circuits (Bluetooth, Wi-Fi, GSM, RFID, USB, etc.);
  hardware logic circuits; and/or additional volatile and/or non-volatile memories.

According to the described embodiments, circuit 5 draws the power necessary to the operation of the circuits that it comprises from the power present in the equipment that it monitors. Indeed, although it is possible to equip circuit 5 with a battery, this is not a preferred embodiment since this makes the performing of the measurements and the delivery of the estimation of the remaining lifetime dependent on the battery charge. In particular, a system for estimating the remaining lifetime of the battery should then also be provided.

Thus, in the embodiment of FIG. 2, circuit 5 comprises a power conversion device 66, for example of switched-mode power supply type, capable of sampling power between the terminals 12 and 14 of capacitor 1 via connections 62 and 64, or more generally from power equipment 3, and to deliver a low voltage (typically a few volts) to power the different components of circuit 5. Preferably, monitoring circuit 5 is thus directly powered across component 1.

As a variant, a power sampling from other elements of the equipment or of the plant comprising this equipment may be provided, provided for the conversion and isolation elements adapted to the relatively lower power supply voltage of circuit 5 with respect to the relatively high voltage present at the level of the equipment or of the plant to be provided.

Circuit 5 implements a specific processing based on the performed measurements.

Preferably, this processing:
- provides estimating the remaining lifetime with a sufficiently high frequency to ensure the reliability of the aging calculation, for example, in the range from one second to one minute, to save the power sampled from the equipment supporting or to which is attached the monitored component;
- leads to a result in terms of remaining lifetime, to minimize the data flow to be transmitted and, thereby, the power consumption of circuit 5;
- is robust to the disappearing of power across terminals 12 and 14 of the capacitor, the remaining lifetime and the operating parameters being stored in non-volatile memory 53 and reloaded (replaced) each time the power reappears, and then being updated at each processing cycle of circuit 5;
- provides the transmission of the last estimated result with a relatively low frequency, for example, in the range from one hour to one week, not necessarily identical to the frequency of the estimates; and/or
- is capable of generating an alert for the distant system in case of a detection of an exceeding of the operating conditions of the monitored component (for example, an exceeded voltage and/or temperature, typically 1,500 V or 85° C. for a power capacitor).

In particular, it is considered that it is in most applications not necessary to communicate to the distant system all the measurements so that the latter estimates the course of the aging and deduces the remaining lifetime therefrom. Indeed, what matters from the point of view of the equipment is to detect, sufficiently soon to avoid a breakdown, a need to replace the monitored component or for a maintenance thereof.

It is thus provided to communicate to the distant system information relative to the result of the estimation of the remaining lifetime rather than all the measurements. The interpretation of the measurements is mainly performed at the level of circuit 5.

Preferably, circuit 5 is also capable, based on the measurements, to generate an alert or alarm indicative of a malfunction at the level of the equipment or of an exceeding of the operating conditions. This enables to launch a maintenance operation independently from the transmission of the remaining lifetime of capacitor 1.

Further, the periodicity or frequency of the measurements, of the calculations, and of the transmissions is selected according to the desired power consumption of circuit 5. Preferably, this power consumption is negligible as seen from equipment 3 and is related to the power consumption linked to the different components of the equipment. Advantage is here taken from the fact that what matters mainly is to communicate information relative to the remaining lifetime. Thus, except for cases of alarms transmitting a malfunction for which a specific transmission (outside of periods of lifetime transmission) may be provided, a frequency in the order of one hour, or even of one day, of one week, or more may be sufficient, due to the time required for the organization of maintenance operations.

In usual systems, the knowledge of the measurement details and of their variation is actually especially useful for the component manufacturer to have statistical data in real operation. However, from the point of view of the user or operator of equipment 3, what matters is to be notified in time when action has to be taken on the component.

Thus, the fact of only transmitting information simply containing the remaining lifetime or a malfunction alert is not disturbing. Further, a lifetime estimation frequency greater than the frequency of sending of the information to the distant system may be provided. Since wireless transmissions are the power-intensive operations with respect to the calculation of the remaining lifetime, this enables to optimize the power consumption without adversely affecting the detection of a possible problem. In particular, in case of a malfunction alert, an immediate transmission may be provided independently from the transmission frequency defined for the value representative of the remaining lifetime.

In most applications requiring an estimation of the lifetime of a component, models enabling to estimate this lifetime with respect to a nominal lifetime and at operating conditions of the component are available.

In the example of film-type capacitors 1, a relation linking the (estimated) remaining lifetime DDV to the nominal lifetime DDVn can take the following form:

$$\frac{DDV}{DDVn} = \left(\frac{V}{Vn}\right)^{-8} 2^{(Tn-T)/15} \quad \text{(Equation 1)}$$

where V represents the current value of the voltage measured across the capacitor, Vn represents the value of the nominal voltage across the capacitor, T represents the current value of the operating temperature of the capacitor, and Tn represents the value of the nominal operating temperature of the capacitor.

The current operating temperature T of the capacitor, used for the calculation of the remaining duration, can be calculated from measurements of the two sensors 57 and 100. For example, the average temperature of the temperatures measured by the two sensors, or the maximum temperature among the temperatures measured by the two sensors, may be used in the lifetime calculation.

According to a preferred implementation mode, the current values are taken into account to both detect a possible coming out of an acceptable operating zone and calculate the remaining lifetime.

This implementation preferably uses a template for defining operating zones of the component according to the measured physical quantities, here voltage V and temperature T.

Figure 3:
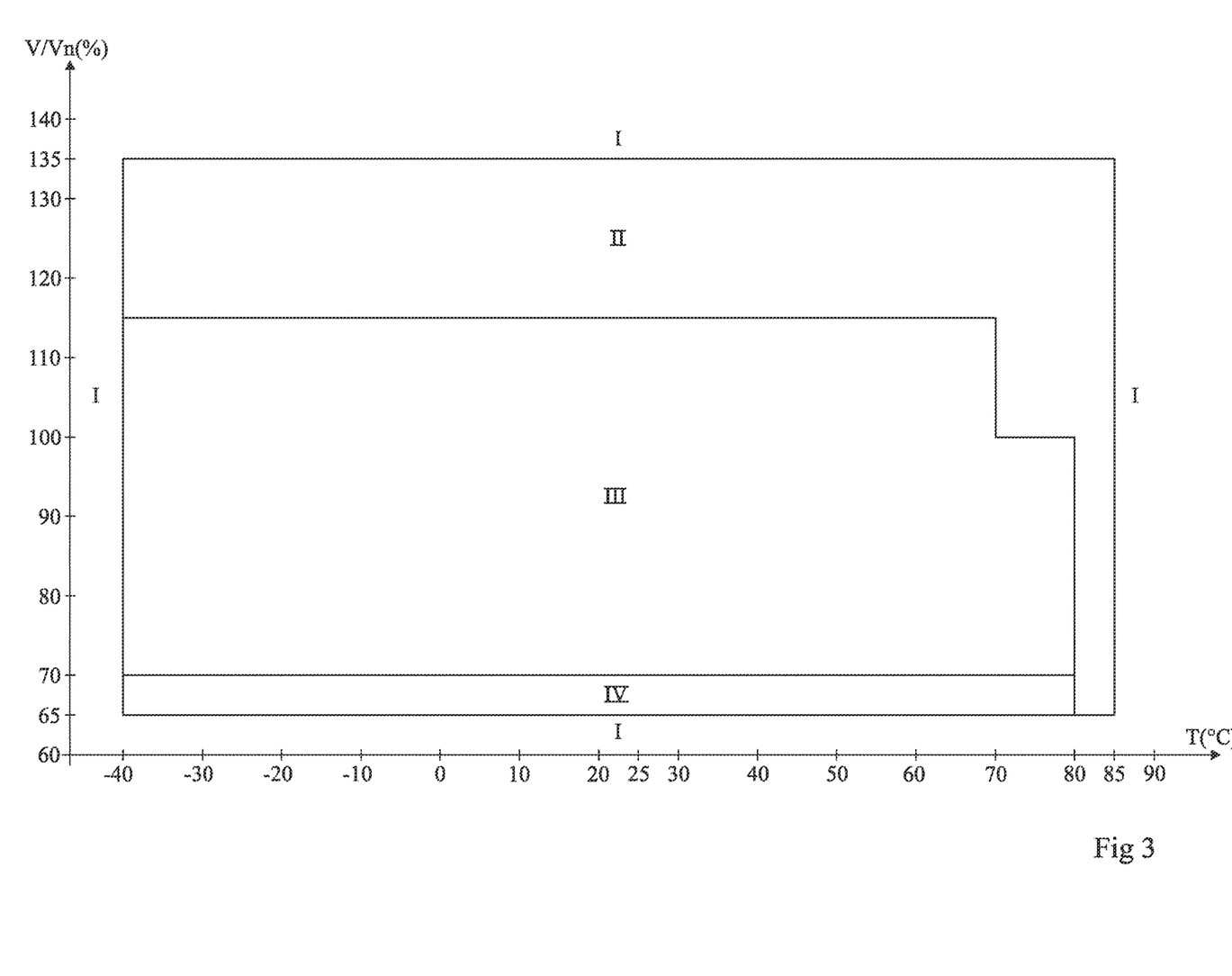
FIG. 3 schematically shows an example of a template for defining operating zones of a capacitor.

FIG. 3 schematically shows an example of a template for defining operating zones of a capacitor.

According to this example, the template enables to define operating zones according to the current temperature T and to the ratio V/Vn (in %) between current value V and nominal voltage Vn.

The template may be established, according to the application, by simulation or from models of the operation and/or of the aging of a capacitor.

In the example of FIG. 3, the four following zones are considered.

A first zone I, non-functional, where the actual electronic circuit 5 is not in acceptable operating conditions. Entering this zone generates an alarm on the operating conditions and positions the indicator of the remaining lifetime at zero (0). This zone here corresponds:

to extreme temperatures, for example, lower than approximately −40° C., preferably lower than −40° C., or higher than approximately 85° C., preferably higher than 85° C.; or to extreme voltages V, for example, lower than approximately 70% of nominal voltage Vn, preferably lower than 70%, of nominal voltage Vn, or higher than approximately 135% of nominal voltage Vn, preferably higher than 135% of nominal voltage Vn.

A second zone II where a situation requiring the emission of an alert or of an alarm, preferably immediate. Entering this zone generates an alarm on the operating conditions and positions the indicator of the remaining lifetime at zero (0). This zone here corresponds, for example:

to voltages V in the range from approximately 115% to approximately 135% of nominal voltage Vn, preferably in the range from 115% to 135% of nominal voltage Vn, for temperatures in the range from approximately −40° C. to approximately 85° C., preferably in the range from −40° C. to 85° C.;

to voltages V in the range from approximately 100% to approximately 135% of nominal voltage Vn, preferably in the range from 100% to 135% of nominal voltage Vn, for temperatures in the range from approximately 70° C. to approximately 85° C., preferably in the range from 70° C. to 85° C.; or to voltages V in the range from approximately 65% to approximately 135% of nominal voltage Vn, preferably in the range from 65% to 135% of nominal voltage Vn, for temperatures in the range from approximately 80° C. to approximately 85° C., preferably in the range from 80° C. to 85° C.

A third zone III where a situation requiring the estimation of the remaining lifetime is considered. This zone here corresponds, for example:

to voltages V in the range from approximately 70% to approximately 115% of nominal voltage Vn, preferably in the range from 70% to 115% of nominal voltage Vn, for temperatures in the range from approximately −40° C. to approximately 70° C., preferably in the range from −40° C. to 70° C.; or to voltages V in the range from approximately 70% to approximately 100% of nominal voltage Vn, preferably in the range from 70% to 100% of nominal voltage Vn, for temperatures in the range from approximately 70° C. to approximately 80° C., preferably in the range from 70° C. to 80° C.

A fourth zone IV (optional) where it is considered that the impact on the remaining lifetime is negligible and that it is not necessary to modify it. This zone here corresponds, for example:

to voltages V in the range from approximately 65% to approximately 70% of nominal voltage Vn, preferably in the range from 65% to 70% of nominal voltage Vn, for temperatures in the range from approximately −40° C. to approximately 80° C., preferably in the range from −40° C. to 80° C.

In practice, the determination of the operating zone where the component is located is preferably performed by comparison of the measurements of voltage V and of temperature T with respect to thresholds representative of the limits of the operating zones.

The operating zones correspond to zones of the voltage/temperature space, with a "central" zone III around a pair of nominal voltage Vn and temperature Tn, at least one "peripheral" zone II of degraded operation of the capacitor different from a "non-functional" zone I where the power supply voltage and the temperature no longer enable monitoring circuit 5 to operate.

Figure 4:
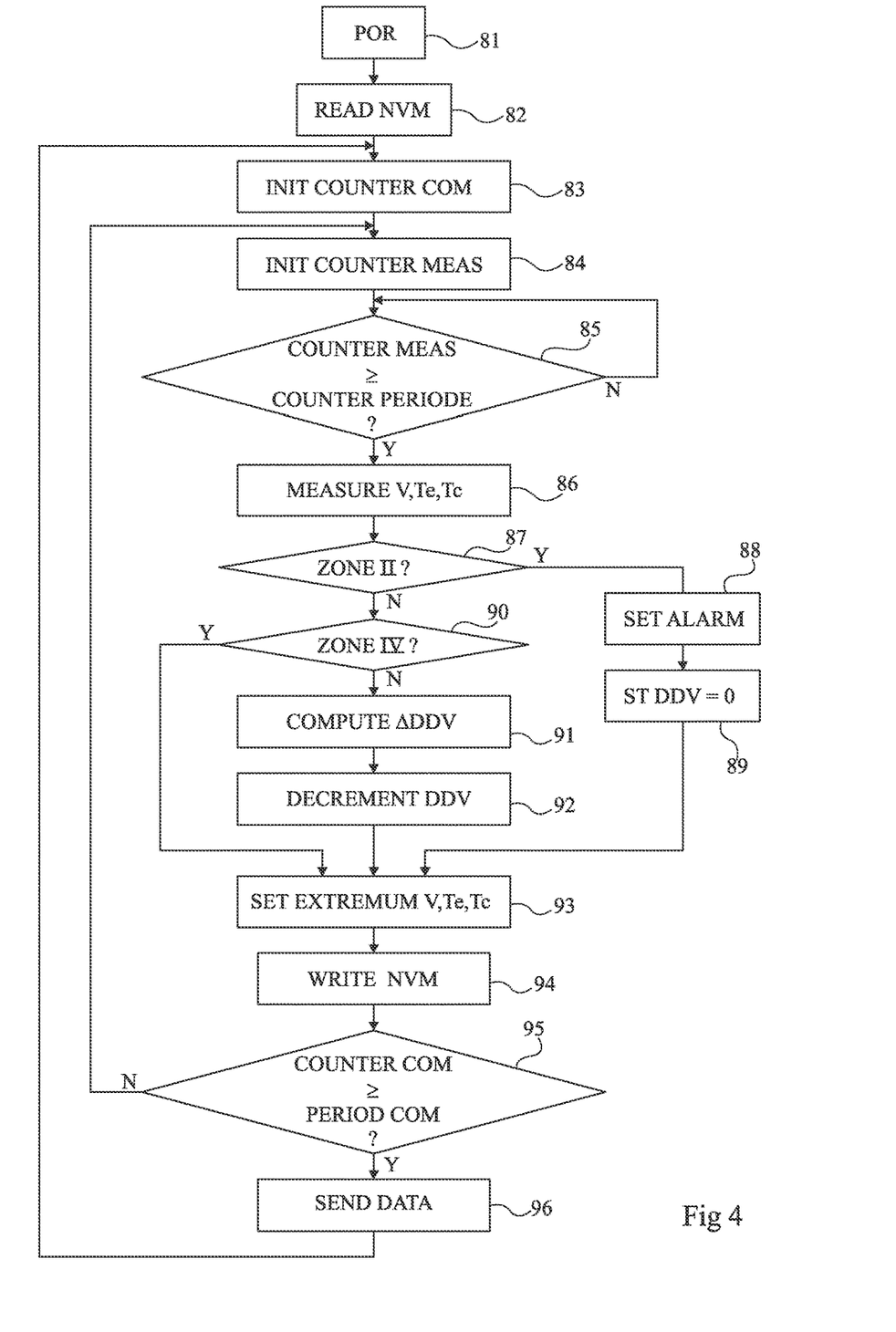
FIG. 4 very schematically shows in the form of blocks steps of an implementation mode of the system of FIG. 1.

FIG. 4 very schematically shows in the form of blocks steps of an implementation mode of a method of monitoring (the operation of) a component.

This process is periodically implemented, with a frequency defined according to the application and to the acceptable intervals, between two measurements and between two transmissions of the remaining lifetime.

It should be noted that it may be impossible, for circuit 5, to determine whether it is in the first non-functional zone I.

According to the implementation mode of FIG. 4, it is provided to store, in the non-volatile memory:

the nominal parameters such as the initial or nominal lifetime DDVn, the nominal voltage Vn, the nominal temperature Tn, and the limits of zones in the form for example of temperature and voltage thresholds;

a value representative of the remaining lifetime DDV;

the measured extreme voltage and temperature values;

one or a plurality of possible alarms.

Circuit 5 also contains, for example in memory 53 (FIG. 2), the coefficients and/or the algorithm of estimation of the remaining lifetime (application of equation 1 in this example).

According to an embodiment, a counter indicating the remaining lifetime is used. This counter is initialized during the first powering on at a value corresponding to the nominal lifetime. Further, at each new starting of the circuit (for example after each powering off), the value DDV stored in the non-volatile memory is used to reset the counter.

Preferably, each time the lifetime has to be decreased, the value of the counter representative of value DDV is updated (decremented). Thus, transmissions to distant system 7 are preferably limited to an alarm message during a malfunction or to the periodic transmission of value DDV (the value of the counter stored in memory 53). Transmissions are thus particularly short and power-efficient with respect to usual solutions.

At each iteration of the method illustrated in FIG. 4, at the powering up following a reset (block 81, POR— Power On Reset) of power management device 66 (FIG. 2), microcontroller 52 (FIG. 2) starts initializing and then reading (block 82, READ NVM) the previous parameters of operation, of calibration (the extreme values of quantities V, Te, and Tc), of alarm, and of remaining lifetime DDV in non-volatile memory 53. The microcontroller then initializes (block 83, INIT COUNTER COM, bloc 84, INIT COUNTER MEAS) time counters (COM, MEAS) regulating the measurement (MEAS) and transmission (COM) periods.

The microcontroller then waits (block 85, COUNTER MEAS>=COUNTER PERIOD?) in standby mode (output N of block 85) for the time COUNTER PERIOD of the measurement period, and then wakes up (output Y of block 85) to perform (block 86, MEASURE V, Te, Tc) the current measurements of voltage V and of temperatures Te and Tc, delivered by sensors 56, 57, and 100.

Then, microcontroller 52 determines or estimates (block 87, ZONE II?) whether the component is located in the second operating zone (II).

If it is (output Y of block 87), an alarm is set (block 88, SET ALARM), for example, by positioning a predefined value in an alarm register. According to another embodiment, not illustrated, it may be provided to trigger, instead of or in addition to the alarm, a data transmission and/or the transmission of an alert or alarm message to distant system 7. The microcontroller also deletes remaining lifetime counter DDV by positioning it at zero (block 89, DDV=0).

If the component is not in the second operating zone (output N of block 87), microcontroller 52 determines (block 90, ZONE IV?) whether the component is in the fourth operating zone (IV).

If the component is not in the fourth zone (output N of block 90), this means that it is in the third operating zone. Microcontroller 52 then estimates (block 91, COMPUTE □DDV) a variation of the remaining lifetime DDV by application of the determination model (formula Math 1), stored in circuit 5, according to the measurement period and to the voltage and temperature values. The result of this determination is fed back into the counter of storage of value DDV, for example, by decrementing this counter (block 92, DECREMENT DDV).

Microcontroller 52 then estimates whether the newly measured voltage and temperature values have exceeded the values of the previous measurements stored in the non-volatile memory, to ensure an extremum setting (block 93, SET EXTREMUM V, Te, Tc).

If the component is in the fourth operating zone (output Y of block 90), this means that a calculation of the remaining lifetime is not necessary. The process then directly proceeds to step 93. This step 93 is also carried out once, in the case where the component is in the second operating zone (output Y of block 87), steps 88 and 89 have been completed.

Once the extreme values have been determined, the remaining lifetime counter, alarm, and extreme level values are stored in the non-volatile memory (block 84, WRITE NVM) to avoid losing the result of the updates in case of a cutting off of the power supply.

The microcontroller then verifies whether it is time to transmit the data according to the programmed communication period PERIOD COM (block 95, COUNTER COM>=PERIOD COM?).

If it is (output Y of block 95), microcontroller 52 triggers (block 96, SEND DATA) the radio transmission of the alert, operation, and remaining lifetime messages. Then, the microcontroller returns to the standby mode (via blocks 83 and 84) while waiting for a new measurement or communication cycle.

If it is not (output N of block 95), the microcontroller directly returns to the standby mode (via block 84).

As already mentioned, the frequencies of estimation of the remaining lifetime DDV and of transmission of this remaining lifetime are not necessarily the same. One may thus adapt, according to the application, the frequency of implementation of the steps illustrated in FIG. 4 to the interval required to notify the distant system, and the frequency of transmission of the remaining lifetime DDV to the distant system at the desired interval between two updates, on the distant system side.

In practice, the search for the operating zone where the capacitor is located by application of the method described in relation with FIG. 4 is performed with a frequency selected according to (or corresponding to) the frequency with which the temperature and voltage measurements are performed. The result (the obtained operating zone) is used to decide of an operation to be performed (particularly the adjustment of the remaining lifetime), resulting in the update of parameters in the non-volatile memory when in zone II (but not when in zone IV).

According to an embodiment, the microcontroller periodically triggers a transmission of value DDV to distant system 7.

According to an embodiment, the calculation of a remaining lifetime DDV which is null or smaller than a threshold triggers the transmission of a signal, preferably to the distant system to allow an action on the equipment. The setting of the threshold depends on the application.

According to an embodiment, the distant system periodically polls circuit 5 (the reading and transmission of value DDV in non-volatile memory 53). Indeed, at any time, the corresponding counter in memory 53 contains the last updated value of the remaining lifetime of the capacitor.

It should be noted that the system does not estimate the effects of the aging of the component, but preferably only its remaining lifetime. This takes part in the low power consumption of circuit 5.

FIG. 5 schematically shows a perspective view of an embodiment of a component 1.

According to this embodiment, component 1 comprises a package having the capacitor (not shown in FIG. 5), two electrodes or terminals 12 and 14 of which come out from the top of the package by crossing an electronic board forming monitoring circuit 5, housed therein. The different circuits forming the monitoring circuit (FIG. 2) bear reference numeral 59 in FIG. 5. The board is crossed by the capacitor connection terminals 12 and 14. Package 13 also integrates the two temperature sensors 57 and 100 of FIG. 2. In the shown example, sensor 100 is placed inside of the capacitor, for example, at the center of the capacitor, for example, if the capacitor is formed from a winding, at the center of the winding. The temperature sensor 57 at the periphery is located on board 5. Thus, the described assembly only comprises two terminals 12 and 14 of wired access to the outside formed of the terminals of connection to the capacitor electrodes (plus, if present, wireless communication elements). The rest of the connections required for the described operation is included in package 1. This amounts, as mentioned hereabove, to considering that the monitoring circuit is contained or "embedded" in the capacitor by being physically integrated to component 1 on manufacturing thereof.

Various embodiments and variants have been described. Those skilled in the art will understand that certain characteristics of these various embodiments and variants may be combined, and other variants will occur to those skilled in the art. In particular, although the estimation of the lifetime of a capacitor has been taken as an example, the described system and method more generally apply to any monitoring of the operation and estimation of the remaining lifetime of a component (for example, a fuse, an electromagnetic relay, a contactor, an inductor, etc.) associated with equipment, preferably comprising no electronic circuits. The described embodiment more particularly easily transpose to a component having an operation that can be estimated from a template taking into account one or a plurality of measurable physical quantities (for example, voltage, current, temperature, pressure, humidity, etc.) conditioning its lifetime and having a lifetime that can be estimated based on these quantities.

Further, although an example relating to an update by decrease of the lifetime has been described, the described embodiments easily transpose to a system where the monitored component is likely to at least partially regenerate, the counter representative of the remaining lifetime being then updated by increment or decrement.

Further, although reference has been made to a microcontroller 52 to perform the required calculations, this microcontroller may be easily replaced with a circuit in wired logic or a field programmable gate array (FPGA) circuit. Similarly, all or part of circuit 5 may be provided to be formed by means of one or a plurality of application specific integrated circuits (ASIC).

Finally, the practical implementation of the embodiments and variants described herein is within the capabilities of those skilled in the art based on the functional indications provided hereinabove. In particular, the programming of microcontroller 52 for a software implementation of the described embodiments is within the abilities of those skilled in the art, as well as the forming of circuits in wired logic for a total or partial hardware implementation.

What is claimed is:

1. Circuit for monitoring a component comprising a capacitor and being associated with equipment, the circuit comprising:
   at least one device for measuring the voltage across the capacitor and the temperature of the capacitor; and
   a circuit for calculating a value representative of a remaining lifetime of the component, applying the following formula:

$$\frac{DDV}{DDVn} = \left(\frac{V}{Vn}\right)^{-8} 2^{(Tn-T)/15}$$

where DDVn represents the nominal value of the lifetime of the capacitor, V represents the current value of the voltage measured across the capacitor, Vn represents the value of the nominal voltage across the capacitor, T represents the current value of the operating temperature of the capacitor, and Tn represents the value of the nominal operating temperature of the capacitor;
   said monitoring circuit being physically integrated to the component on manufacturing thereof and being directly powered across the capacitor; and
   said calculation using at least two temperature measurements distributed inside or on top of the capacitor, to detect temperature variations likely to occur locally at different points of the capacitor.

2. Circuit according to claim 1, wherein the component is formed of a package having said capacitor, said monitoring circuit, two temperature sensors positioned therein, said package comprising two and only two terminals.

3. Method of monitoring the operation of a component comprising a capacitor and associated with equipment, comprising the steps of:
   measuring the voltage across the capacitor and the temperature of the capacitor; and
   calculating a value representative of a remaining lifetime of the component, applying the following formula:

$$\frac{DDV}{DDVn} = \left(\frac{V}{Vn}\right)^{-8} 2^{(Tn-T)/15}$$

where DDVn represents the nominal value of the lifetime of the capacitor, V represents the current value of the voltage measured across the capacitor, Vn represents the value of the nominal voltage across the capacitor, T represents the current value of the operating temperature of the capacitor, and Tn represents the value of the nominal operating temperature of the capacitor,
   said calculation:
   being performed in a circuit physically integrated to the component on manufacturing thereof and being directly powered across the capacitor; and
   using at least two temperature measurements distributed inside or on top of the capacitor, to detect temperature variations likely to locally occur at different points of the capacitor.

4. Method according to claim 3, wherein the value representative of the remaining lifetime is stored in non-volatile fashion in the monitoring circuit.

5. Method according to claim 3, wherein said value representative of the remaining lifetime is transmitted to a distant system over a wireless link.

6. Method according to claim 5, wherein the frequency of transmission of said value representative of the remaining lifetime is smaller than the frequency of calculation of this value.

7. Method according to claim 3, wherein:
   current voltage and temperature measurements are compared with thresholds to determine an operating zone where the capacitor is located, the operating zones corresponding to zones of the voltage/temperature space, with a "central" zone around a nominal voltage and temperature pair, at least one "peripheral" zone of degraded operation of the capacitor different from a "non-functional" zone where the power supply voltage and the temperature no longer enable the monitoring circuit to operate;
   the operating zone where the capacitor is located conditioning the non-volatile storage of a parameter in the monitoring circuit.

8. Method according to claim 7, wherein the operating zone of the capacitor conditions the implementation of the calculation of the value representative of the lifetime and its non-volatile storage.

9. Method according to claim 8, wherein, in an operating zone, no update of the value representative of the remaining lifetime is performed.

10. Method according to claim 7, wherein said value representative of the remaining lifetime is transmitted to a distant system over a wireless link and wherein an operating zone further conditions the transmission of a signal representative of a malfunction of the capacitor to the distant system.

11. Method according to claim 10, wherein a counter of the remaining lifetime is deleted by being positioned at zero.

12. Method according to claim 3, wherein the calculation of the value representative of the remaining lifetime is performed at a frequency in the range from one second to one minute.

13. Method according to claim 3, wherein said points of the capacitor comprise points at the periphery and at the center of the component.

14. Method according to claim 3, wherein the temperature taken into account for the calculation of the remaining lifetime is equal to the average of the temperatures measured by the temperature sensors.

15. Method according to claim 14, wherein the temperature taken into account for the calculation of the remaining lifetime is equal to the maximum value among the temperatures measured by the temperature sensors.

16. Method according to claim 3, wherein a remaining lifetime which is null or smaller than a threshold triggers the emission of a signal.

17. System comprising:
   an equipment;
   a component associated with the equipment; and
   a circuit according to claim 1.

* * * * *